(12) United States Patent
Dang et al.

(10) Patent No.: US 8,342,385 B2
(45) Date of Patent: Jan. 1, 2013

(54) PROCESS FOR MAPPING FORMIC ACID DISTRIBUTION

(75) Inventors: Bing Dang, Armonk, NY (US); Raymond R. Horton, Dover Plains, NY (US); Robert J. Polastre, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/089,074

(22) Filed: Apr. 18, 2011

(65) Prior Publication Data

US 2012/0261458 A1 Oct. 18, 2012

(51) Int. Cl.
*B23K 31/02* (2006.01)
*B23K 35/38* (2006.01)

(52) U.S. Cl. ........ 228/220; 228/223; 228/205; 228/103; 438/612; 438/613

(58) Field of Classification Search .................. 228/103, 228/180.21, 180.22, 220, 223; 438/108, 438/612, 613
See application file for complete search history.

(56) References Cited

U.S. PATENT DOCUMENTS

| | | | | |
|---|---|---|---|---|
| 4,623,086 A | * | 11/1986 | Tihanyi et al. | 228/123.1 |
| 6,133,135 A | * | 10/2000 | Katayama et al. | 438/612 |
| 6,525,829 B1 | * | 2/2003 | Powell et al. | 356/630 |
| 6,601,754 B2 | * | 8/2003 | Miyake et al. | 228/224 |
| 7,481,353 B2 | * | 1/2009 | Miyake | 228/223 |
| 7,648,901 B2 | * | 1/2010 | Tu et al. | 438/613 |

OTHER PUBLICATIONS

Smart Equipment Technology; "SET Introduces Innovative Patented Chamber for Removal of Oxide;" Press Release; Oct. 18, 2010 (Web Publication).
Smart Equipment Technology; "SET's latest developments in Removal of Oxide;" Press Release; Undated(Web Publication).
Farrens, Shari "Wafer and Die Bonding Technologies for 3D Integration;" MRS Fall 2008 Proceedings E; Suss Microtech; dated Fall 2008.

* cited by examiner

*Primary Examiner* — Devang R Patel
(74) *Attorney, Agent, or Firm* — Robert J. Eichelburg; The Law Offices of Robert J. Eichelburg

(57) ABSTRACT

A transfer process for bonding a solderable device to a solderable firsl substrate having a first oxidized surface comprises placing the solderable device proximate to the first substrate in a reducing chamber, where the first surface cannot be visually observed. We place a second substrate having a second oxidized surface in the chamber in a way to visually observe the second surface. Selecting the first substrate and the second substrate so that the reduction of the second surface correlates with the reduction of the first surface provides an indication of the degree of reduction of the first surface. Introducing a reducing agent into the chamber under reducing conditions reduces the surfaces which we track by irradiating and observing the second surface; evaluate any change in the second surface during irradiation and correlate the change with first surface reduction. When sufficiently reduced, we solder the first substrate to the device.

13 Claims, 2 Drawing Sheets

PROCESS FOR MAPPING FORMIC ACID DISTRIBUTION

FIELD OF THE INVENTION

The field of the invention comprises reduction of metal oxides on substrates used in forming electrical interconnects between semiconductor devices and the substrates.

BACKGROUND OF THE INVENTION

For solder flip chip assembly of a first level package or device, the solder interconnects are formed by joining solder bumps on the chip with solder bumps on the substrate. The solder bumps on the substrate help compensate for chip bump height variations and substrate warpage. Flip chip technology allows the largest numbers of inputs/outputs ("I/Os") for the smallest footprint of the chip. This enables manufacturing small packages known in the art as chip-scale packages.

IBM introduced this technology in the early 1960's with the solid logic technology in their IBM System/360™. It extended interconnection capabilities beyond existing wire-bonding techniques, allowing the area array solder-bump configuration to extend over the entire surface of the chip (die) providing solder bumps for interconnection to a substrate by the so-called "C4" process. This allowed for the highest possible I/O counts to meet the increasing demand for electrical functionality and reliability in IC technology. "C4" comprises the term for describing the process of connecting semiconductor and other devices, also known as the IBM "flip chip" or "controlled collapse chip connection," from which the industry derives the acronym "C4." The devices that employ C4 technology comprise integrated circuits ("IC" chips), passive filters, detector arrays and microelectromechanical systems ("MEMS") all of which are well known in the art. The present invention comprises processes used in the manufacturing of these devices, and the products obtained by these processes.

The C4 process interconnects devices to external circuitry by means of solder bumps that have been deposited on semiconductor chip pads or metal substrates. In order to mount the chip to external circuits such as a circuit board or another chip or a wafer used in manufacturing other chips, a chip having solder bumps is flipped over so that the solder is aligned with matching connecting sites (e.g., connector pads) on an external circuit, and the connection completed by raising the temperature of the solder so that it flows and adheres to the connecting sites. In these applications, the chip may be made of conventional semiconductor materials known in the art or compound semiconductor materials (e.g., GaAs, HgCdTe, InP, etc) attached to CMOS readout circuits through very high density Indium Micro Bump Arrays.

Oxidation of substrates, however, causes problems with solder adhesion. Systems Equipment Technology ("SET") along with other manufacturers of bonding equipment address the issue, noting oxides generally adhere poorly to other metals or oxides which causes defects in chip manufacture. The bonding force employed in the manufacturing process must be sufficient to cause penetration of the oxide to achieve metal-to-metal cohesion or adhesion. Not only do the oxides increase the required bonding force, but they may also raise the electrical resistance of the joint. Even after the device has been bonded, existing oxides may provide a convenient site for further oxidation, leading to reliability and performance problems.

The industry recognizes breaking through the oxide can be performed by mechanical scrubbing, but this process is only effective with large bumps at loose alignment tolerances. An alternative solution is to use liquid flux to reduce the oxide, but this requires an additional cleaning step to remove flux residues which becomes very difficult at small gaps between dies.

They go on to note that high quality and reliable bonding often require an oxygen free environment to prevent oxide formation during the bonding sequence at elevated temperature. Some materials in the chip assembly such as Indium form oxides at room temperature which must also be removed before bonding for the same reasons. The need to remove and prevent oxides in situ to achieve proper joining therefore becomes apparent, especially where the chip is made of compound semiconductor materials as noted above.

SET has developed a substrate chuck and a bond head with a localized confinement chamber which operates safely with reducing gases such as forming gas or formic acid vapor. This configuration has been successfully implemented on SET bonder models FC.150 and FC300, a chip/wafer bonding apparatus or C4NP transfer tool.

To preserve the standard capabilities of their hybridization equipment and especially the low contact force measurement applied to the components, SET has developed a "semi-open" confinement chamber with no hardware sealing. A non-contact virtual seal is used to ensure gas collection and prevent oxygen intrusion.

The principle of the SET virtually sealed confinement chamber consists of a non-contact virtual seal of the microchamber to enable gas confinement for chip-to-chip or chip-to-wafer bonding under controlled atmosphere while preserving the alignment of the device with respect to its substrate. The process employs a chip-to-chip or a chip-to-wafer configuration in which the process gas is injected through horizontal nozzles towards the device being bonded; an exhaust ring removes the process gas from the micro-chamber and into the gas exhaust line, keeping the gas out of the machine and the clean room; a nitrogen curtain formed around the exhaust, ensuring that ambient air is not entrained into the micro-chamber by the Venturi effect; and a cover attached to the bond head to create a confined micro-chamber.

This configuration of the SET apparatus enables two operation modes: first, an inert gas such as nitrogen to prevent oxide formation on bonding surfaces during the bonding sequence; second, a forming gas such as gaseous formic acid is employed to remove and prevent oxide formation prior to bonding, thus ensuring good wetting and high quality solder joints. This is well-suited for applications using Indium. This confinement chamber can be used with pure nitrogen, nitrogen saturated with formic acid vapor or process gases. The gas saturation is adjustable to meet the process requirements and provide high quality and reliable bonding; allows for reduced bonding forces and temperatures due to oxide-free surfaces; eliminates the need for other cleaning steps with flux-less bonding; and provides higher yield and reliability by thorough removal of oxides.

During the process however, it is difficult to track the effective distribution of the reducing gas such as formic acid since the working gap between the metal substrate such as copper and the device is very small.

Accordingly, it is desirable to have a process or a way to follow the distribution of the reducing gas.

SUMMARY OF THE INVENTION

The present invention provides structures, articles of manufacture and processes that address these needs to not only provide advantages over the related art, but also to substantially obviate one or more of the foregoing and other limitations and disadvantages of the related art such as providing a process or a way for tracking the effective distribution of the reducing gas or formic acid in the C4 process used for manufacturing these devices where the working gap between the components of the device being assembled is very small. Not only do the written description, claims, and abstract of the disclosure set forth various features, objectives, and advantages of the invention and how they may be realized and obtained, but these features, objectives, and advantages will also become apparent by practicing the invention.

To achieve these and other advantages, and in accordance with the purpose of the invention as embodied and broadly described herein, the invention comprises a process, composition, and an improved structure. The invention in one embodiment comprises a process and a product produced by the process comprising placing a wafer with a visible oxidized metal surface, such as a wafer having a copper oxide surface in the working area of the device used to join the components of a semiconductor by means of a C4 process in order to map the effective distribution of a reducing agent, such as formic acid used in the process for removal of metal oxides.

BRIEF DESCRIPTION OF THE DRAWINGS

The accompanying drawings are not drawn to scale but nonetheless set out the invention, and are incorporated in and constitute a part of this specification and are included to illustrate various embodiments of the invention, and together with this specification also serve to explain the principles of the invention.

DETAILED DESCRIPTION OF THE INVENTION

Figure 1A:
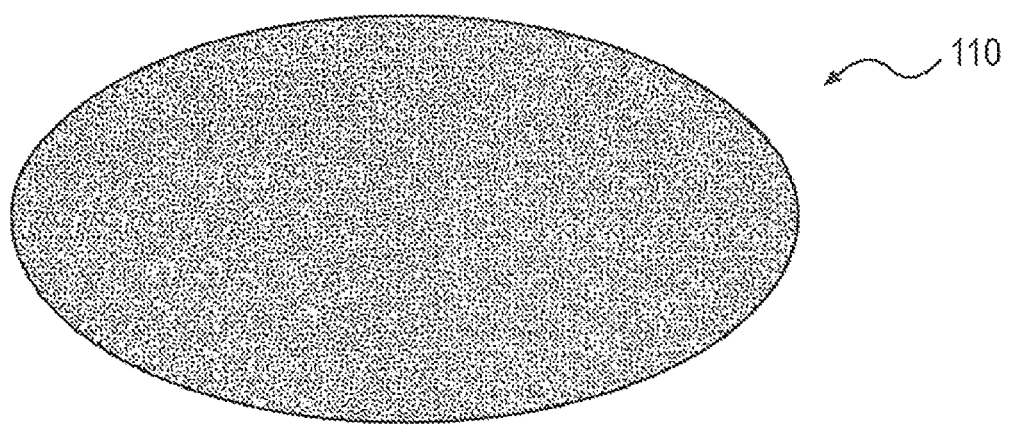
FIG. 1A comprises a plan view of a substrate with an oxidized metal surface having a dark color.

To achieve these and other advantages, and in accordance with the purpose of this invention as embodied and broadly described herein, the following detailed embodiments comprise disclosed examples that can be embodied in various forms.

The specific processes, compounds, compositions, and structural details set out herein not only comprise a basis for the claims and a basis for teaching one skilled in the art to employ the present invention in any novel and useful way, but also provide a description of how to make and use this invention. Not only do the written description, claims, abstract of the disclosure, and the drawings that follow set forth various features, objectives, and advantages of the invention and how they may be realized and obtained, but these features, objectives, and advantages will also become apparent by practicing the invention.

In one embodiment, we provide a C4 transfer process for bonding a semiconductor component to a first substrate in a closed environment where the first substrate is susceptible to oxidation that cannot be readily ascertained by visual observation. We conduct the process in a reducing atmosphere and place a second substrate in the closed environment, where the second substrate has an oxidized surface and is positioned so that it is visible through viewing ports in the closed environment. We conduct the C4 process in the reducing atmosphere for a period of time sufficient to reduce the oxidized surface, which we can visually observe. We then solder the semiconductor component to the first substrate in the closed environment using a process well known in the art.

The first substrate and the second substrate in one embodiment comprise metal substrates, such as copper, tin, silver, lead, indium, antimony, iron, zinc, or the metals of the group comprising those having atomic numbers 21 to 31 inclusive, mixtures of the foregoing metals and alloys of the foregoing metals. In another embodiment the first substrate and the second substrate are composed of the same material.

In practicing the invention we use a C4 bonding apparatus such as the SET bonder models FC.150 or FC300, which allow for formic acid vapor injection during in-situ bonding, after alignment of the components (chips and substrates) and just before bonding. When the components are nearly in contact, the formic acid vapor is injected into this microchamber, removing any oxides and enabling low-force bonding. Both components remain secured to their respective supports during the entire process. The post-bonding accuracy varies from about ±0.5 to about 3 um according to machine configuration.

This technique has been developed to avoid using liquid fluxes especially for infrared focal plane array applications where these fluxes are extremely difficult to clean after bonding. Indium oxides are easily removed in the formic acid vapors. Other applications for this technique include: optoelectronics i.e. laser bar application with AuSn; 3D IC's with Copper-to-Copper processes; other applications where oxide removal is necessary before reflow.

Formic Acid Vapor efficiency is demonstrated with the SET apparatus (SET bonder models FC.150 and FC300) using wafer coupons with copper metallization as follows.

Heating Cycle with Formic Acid Vapor (FAV) Environment:

The Formic acid vapor prevents oxide formation while the sample is heated >> about 30 seconds at about 350° C.—FAV at 2 bar, ~8 liters/minute Heating Cycle in Ambient Air:

Oxygen around the component contributes to heavy oxide formation >>> about 3 seconds at about 350° C.—No gas injection/Ambient air environment Heating Cycle with Formic Acid Vapor Environment:

The formic acid vapor is reintroduced in the chamber where the copper plated wafer coupon was initially oxidized. The reducing efficiency of the formic acid vapor is visible by naked eye only after few seconds. >> about 30 seconds at about 350° C.—FAV at 2 bar, ~8 liters/minute.

As part of the last heating cycle with formic acid vapor (FAV) environment we insert into the apparatus a device to be assembled by the C4 process and accurately determine the end point of the process that assure the device is assembled substantially free of oxides that interfere with the bonding of the components to one another through the solder connections effected by the C4 process. In addition to formic acid, other low molecular weight organic reducing agents may be employed comprising low molecular weight organic acids and aldehydes. In addition to organic acids having 1 carbon atom, the low molecular weight organic acids can have up to about 4 carbon atoms or 1 to about 3 carbon atoms. The corresponding aldehydes of these acids comprise some of the other low molecular weight organic reducing agents used according to the invention. Inorganic reducing agents can also be used such as hydrogen and carbon monoxide. The reducing agents include mixtures of reducing agents as well. The reducing agents can be used in combination with inert gases in addition to nitrogen, such as the rare gases, He, Ne, Ar, Kr, and Xe. Rn, a rare gas, ordinarily would not be used because it is radioactive. The inert gas includes mixtures of inert gases.

Figure 1B:
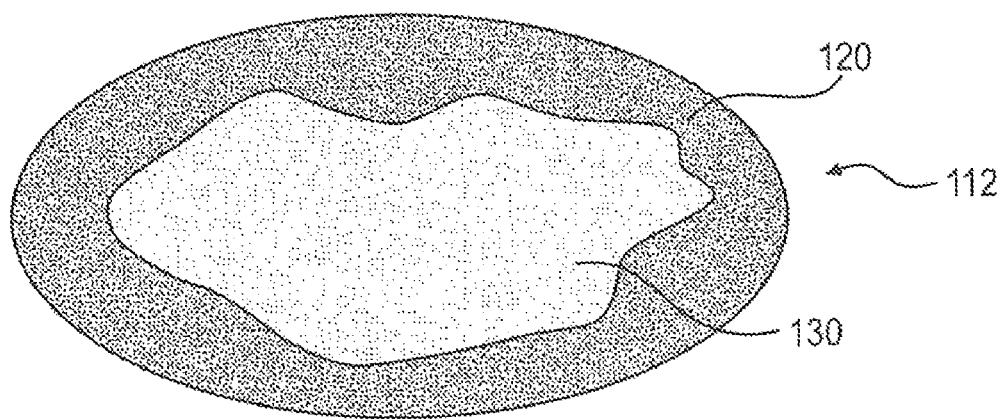
FIG. 1B comprises a plan view of the substrate of FIG. 1A that has been reduced in part and shows both an oxidized metal surface having a dark color and a reduced metal oxide surface having a light color.
Figure 2:
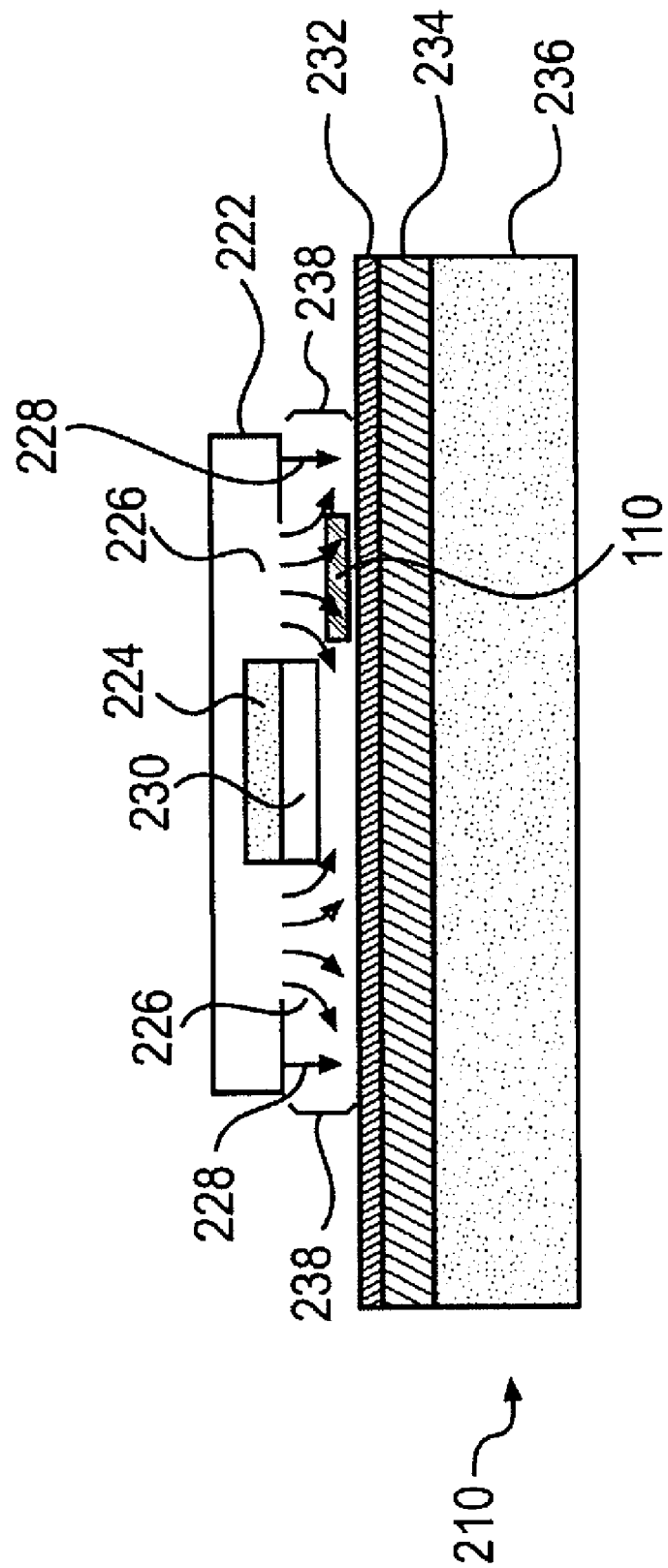
FIG. 2 comprises a side elevation in cross-section of a closed bonding chamber operatively associated with a bonding tool, and a metal substrate having a metal oxide layer positioned on a substrate.

We illustrate an important feature of the invention in FIGS. 1A, 1B, and 2 which comprises the use of wafer 110 to indirectly follow the progression of the reduction of oxide layer 232 because the working gap between the semiconductor device or wafer (semiconductor component 230) and oxide layer 232 is small making it difficult or impossible to observe the oxide layer 232 under reducing conditions. Prior to conducting the reduction reaction we insert wafer 110 into chamber 222 in a position so we can observe it through viewing port 238.

Wafer 110 (FIG. 1A) comprises a dark colored oxidized metal wafer which is converted into wafer 112 (FIG. 1B) under reducing conditions to produce a lighter colored area 130 comprising a reduced metal oxide area and leaving the dark colored oxidized metal area 120.

In one aspect of the invention, we select wafer 110 to correlate with the condition of substrate oxide layer 232 and metal layer 234. The oxide surface on wafer 110 may be the same or different than the oxide layer 232. If different, a difficultly reduced oxide surface on wafer 110 (as compared to oxide layer 232) would, after reduction, comprise a different color and would be a good indicator for substantial or complete reduction of a more easily reduced oxide layer 232 and vice-versa. In one embodiment, both wafer 110 and substrate 234 comprise the same metal, such as copper and the oxide layer on their surfaces comprise an oxide of copper, such as cuprous oxide or cupric oxide or mixtures thereof.

We determine the progress of the reduction by examining the wafer 110 by visual observation after irradiating it with a radiant energy source or by using known instruments to measure the change in its surface by the energy reflected from, refracted from, or transmitted through it. The radiant energy source may comprise visible light such as daylight, including the individual spectra in the visible light as well as any combination of the individual spectra. We can also employ incandescent light, fluorescent light, sodium D vapor light, mercury vapor light, or other radiant energy such as UV, EUV, DUV, IR, X-Ray, beta ray, or gamma ray radiation and the art-known equivalents thereof. In another embodiment, we may remove the wafer 110 from the chamber 222 and observe or measure any change to the oxide coating on it by any of the aforementioned processes, or by chemical analyses known in the art.

We illustrate the bonding process in FIG. 2 which comprises a bonding assembly 210 for joining surfaces together as described herein, the bonding assembly 210 further including a bonding chamber 222 operatively associated with a bonding tool 224 known in the art, and semiconductor component 230. In use, the oxide layer 232 on metal substrate 234 is reduced to a metal by means of a reducing gas 226, such as formaldehyde introduced into bonding chamber 222. We provide an inert gas curtain 228 (e.g., nitrogen) on the periphery of the bonding chamber 222 to prevent or minimize the escape of the reducing gas 226. The bonding chamber 222 and substrate 236 are brought together in the bonding process by means known in the art to cause semiconductor component 230 to contact the metal surface obtained. Solder on the semiconductor component 230 causes it to adhere to the metal surface 234 when the bonding chamber is activated to generate temperatures that promote solder adhesion.

In one aspect, the invention comprises transfer process for bonding a solderable device to a solderable first substrate having a first oxidized surface comprises placing the solderable device proximate to the first substrate in a substantially closed environment, where the first oxidized surface cannot be visually observed in the closed environment.

This is followed by placing a second substrate having a second oxidized surface in the closed environment in a way to visibly present the second oxidized surface in the closed environment and then selecting the first substrate and the second substrate so that the reduction of the second oxidized surface correlates with the reduction of the first oxidized surface and provides an indication of the degree of reduction of the first oxidized surface. The next step comprises conducting the process in a reducing environment comprising a reducing agent, where the effective distribution of the reducing agent with regard to the first substrate cannot be visually observed in the closed environment, the reducing environment being sufficient to reduce the second oxidized surface to a reduced second oxidized surface and the first oxidized surface to a reduced first oxidized surface.

Irradiating the second oxidized surface with radiant energy follows step of conducting the process in a reducing environment. We then evaluate any change in the second oxide surface during the irradiating and correlate the change with first oxidized surface reduction and second oxidized surface reduction. We then abut the solderable surface against the reduced first oxidized surface when the evaluating indicates that the first oxidized surface has been substantially reduced to the point where it can be soldered; and solder the solderable surface to the reduced first oxidized surface. In another aspect, the transfer process comprises a C4 transfer process.

Accordingly, in one embodiment the invention comprises a transfer process for bonding a device having a solderable surface to a first substrate having a first oxidized surface comprising placing the solderable device proximate to the first oxidized surface in a reducing chamber wherein the first oxidized surface cannot be visually observed in the reducing chamber. We place a second substrate having a second oxidized surface in the reducing chamber in a way so that the second oxidized surface can be visually observed through a viewing port in the reducing chamber. In this process we select the first substrate and the second substrate so that reduction of the second oxidized surface correlates with reduction of the first oxidized surface and provides an indication of degree of reduction of the first oxidized surface.

We conduct the process in a reducing environment comprising a reducing agent, where effective distribution of the reducing agent with regard to the first substrate cannot be visually observed in the reducing chamber. The reducing environment is sufficient to reduce the second oxidized surface to a reduced second oxidized surface and the first oxidized surface to a reduced first oxidized surface. We then irradiate the second oxidized surface with radiant energy; evaluate any change in the second oxide surface during the irradiating and correlate the change with first oxidized surface reduction and second oxidized surface reduction. We abut the solderable surface against the reduced first oxidized surface when the evaluation indicates that the first oxidized surface has been substantially reduced to a point where it can be soldered; after which we solder the solderable surface to the reduced first oxidized surface.

In other embodiments the process comprises a controlled collapse chip connection transfer process; the radiant energy comprises visible light; the first substrate and the second substrate are composed of the same material, such as a metal, e.g., copper; the reducing gas comprises an organic reducing gas such as a low molecular weight organic acid, e.g., formic acid or an organic aldehyde, or the reducing gas comprises an inorganic reducing gas such as hydrogen or carbon monoxide. Also, the reducing gas may contain an inert gas.

Throughout this specification, and abstract of the disclosure, the inventors have set out equivalents, including without limitation, equivalent radiant energy and individual spectra falling within any radiant energy, as well as combinations of elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher.

All scientific journal articles and other articles, including internet sites, as well as issued and pending patents that this written description or applicants' Invention Disclosure Statements mention including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the aforesaid references cited therein, as all or any one may bear on or apply in whole or in part, not only to the foregoing written description, but also the following claims, and abstract of the disclosure.

Although the inventors have described their invention by reference to some embodiments, other embodiments defined by the doctrine of equivalents are intended to be included as falling within the broad scope and spirit of the foregoing written description, and the following claims, and abstract of the disclosure.

We claim:

1. A transfer process for bonding a device having a solderable surface to a first substrate having a first oxidized surface comprising:
   (i) placing said solderable surface proximate to said first oxidized surface in a reducing chamber, where said first oxidized surface cannot be visually observed in said reducing chamber
   (ii) placing a second substrate having a second oxidized surface in said reducing chamber in a way so that said second oxidized surface can be visually observed through a viewing port in said reducing chamber;
   (iii) selecting said first substrate and said second substrate so that the reduction of said second oxidized surface correlates with the reduction of said first oxidized surface and provides an indication of the degree of reduction of said first oxidized surface;
   (iv) conducting said process in a reducing environment comprising a reducing agent, where the effective distribution of said reducing agent with regard to said first substrate cannot be visually observed in said reducing chamber, said reducing environment being sufficient to reduce said second oxidized surface to a reduced second oxidized surface and said first oxidized surface to a reduced first oxidized surface;
   (v) irradiating said second oxidized surface with radiant energy;
   (vi) evaluating any change in said second oxide surface during said irradiating and correlating said change with first oxidized surface reduction and second oxidized surface reduction;
   (vii) abutting said solderable surface against said reduced first oxidized surface when said evaluating indicates that said first oxidized surface has been substantially reduced to the point where it can be soldered; and
   (viii) soldering said solderable surface to said reduced first oxidized surface.

2. The process of claim 1 comprising a controlled collapse chip connection transfer process.

3. The process of claim 1 wherein said radiant energy comprises visible light.

4. The process of claim 1 wherein said first substrate and said second substrate are composed of the same material.

5. The process of claim 3 wherein said first substrate and said second substrate comprise a metal.

6. The process of claim 4 wherein said metal comprises copper.

7. The process of claim 1 wherein said reducing agent comprises an organic reducing gas.

8. The process of claim 7 wherein said organic reducing gas comprises a low molecular weight organic acid or an organic aldehyde.

9. The process of claim 7, wherein said organic reducing gas comprises formic acid.

10. The process of claim 1 wherein said reducing agent comprises an inorganic reducing gas.

11. The process of claim 10 wherein said inorganic reducing gas comprises hydrogen.

12. The process of claim 1 wherein said reducing agent comprise carbon monoxide.

13. The process of claim 1 wherein said reducing agent contains an inert gas.

* * * * *